United States Patent
Mizuno et al.

(10) Patent No.: US 7,733,063 B2
(45) Date of Patent: Jun. 8, 2010

(54) APPARATUS FOR CALCULATING QUANTITY INDICATING CHARGED STATE OF ON-VEHICLE BATTERY

(75) Inventors: Satoru Mizuno, Okazaki (JP); Katsunori Tanaka, Haguri-gun (JP)

(73) Assignees: Denso Corporation, Kariya (JP); Nippon Soken, Inc., Nishio (JP)

( * ) Notice: Subject to any disclaimer, the term of this patent is extended or adjusted under 35 U.S.C. 154(b) by 389 days.

(21) Appl. No.: 11/710,562

(22) Filed: Feb. 26, 2007

(65) Prior Publication Data

US 2007/0200567 A1    Aug. 30, 2007

(30) Foreign Application Priority Data

Feb. 24, 2006   (JP)   .............................. 2006-049038

(51) Int. Cl.
H02J 7/00       (2006.01)
G01N 27/416    (2006.01)

(52) U.S. Cl. ...................... 320/136; 320/132; 320/133; 324/430; 324/432

(58) Field of Classification Search .................. 320/132, 320/136; 324/430
See application file for complete search history.

(56) References Cited

FOREIGN PATENT DOCUMENTS

| | | |
|---|---|---|
| DE | 697 30 677 T2 | 9/2005 |
| JP | A 2002-168929 | 6/2002 |
| JP | A 2002-343444 | 11/2002 |
| JP | A-2005-065482 | 3/2005 |
| JP | A 2005-146939 | 6/2005 |

OTHER PUBLICATIONS

Mar. 9, 2010 Office Action issued in German patent application No. 10 2007 009 041.4-35 (with translation).

*Primary Examiner*—Edward Tso
*Assistant Examiner*—Yalkew Fantu
(74) *Attorney, Agent, or Firm*—Oliff & Berridge, PLC

(57) ABSTRACT

An apparatus is provided to calculate a quantity indicating a charged state of an on-vehicle battery. The battery powers a starter starting up an on-vehicle engine. In the apparatus, a plurality of pairs of data consisting of current and voltage of the battery are acquired at predetermined sampling intervals during a cranking period of the engine in response to starting up the starter. At intervals, a value of an internal resistance of the battery is calculated based on the plurality of pairs of data of current and voltage. The internal resistance is one kind of the charged-state indicating quantity. An open voltage difference is calculated, which is a difference between a pseudo circuit-open voltage of the battery given before starting up the starter and a pseudo circuit-open voltage of the battery given after the cranking period. The value of the internal resistance is corrected using the open voltage difference.

15 Claims, 9 Drawing Sheets

APPARATUS FOR CALCULATING QUANTITY INDICATING CHARGED STATE OF ON-VEHICLE BATTERY

CROSS REFERENCE TO RELATED APPLICATION

The present application relates to and incorporates by reference Japanese Patent application No. 2006-49038 filed on Feb. 24, 2006.

BACKGROUND OF THE INVENTION

1. Field of the Invention

The present invention relates to an apparatus for calculating a quantity indicating the charged state (also called "internal charged state" or "internal state") of a secondary (rechargeable) battery mounted on a vehicle, and in particular, to the apparatus that calculates the charged state using at least a plurality of pairs of voltage and current acquired from the on-vehicle battery.

2. Description of the Related Art

In general, it is required that the capacity and safety of on-vehicle battery systems be strictly managed. To perform such a management, the charged state of an on-vehicle battery system should be estimated with precision.

Several apparatuses to provide some techniques for the estimation have now been proposed. Such techniques use, for example, pseudo circuit-open voltage, internal resistance, charged rate, and/or remaining capacity. For example, as to detecting the internal resistance, there have been known Japanese Patent Laid-open Publication Nos. 2002-343444 and 2005-146939, in which a regression line is obtained on a current/voltage characteristic of a battery system to compute the amount of its slope as an internal resistance of the battery system. Another technique is provided by Japanese Patent Laid-open Publication No. 2002-168929. According to this publication, pairs of voltage/current of an on-vehicle battery are sampled during a period of time during which current consumed by a starter increases from zero to a peak value as high as some 1000 A in response to the start up of the starter, and then the acquired pairs of voltage/current are used to calculate the internal resistance of the battery in controlling the battery state.

In the period of time during which the starter-consuming current increases in response to the startup (hereinafter, this period is referred to as a "starter-current increasing period," refer to FIG. 13), large changes in the current necessary for calculating the internal resistance with precision can be acquired in a short period of time. Thus, in this period of time, the influence of changes in the polarization of the battery in the calculation can be neglected, so that it may be expected that the internal resistance is detected with precision, with very small error due to polarization changes.

However, the foregoing starter-current increasing period is very short (for example, 2-5 msec). This means that a signal processing circuit to acquire a large number of pairs of voltage/current in such a short time should have a high signal processing performance. Specifically, this signal processing circuit includes a current sensor and an A/D converter for digitizing the current and voltage acquired, so that these circuit components need a higher sampling rate. To have such a high signal processing performance results in a rise in parts costs of the signal processing circuit.

In addition, a high-amplitude current which instantaneously reaches a value as high as 1000 A flows through the starter in the starter-current increasing period. The current sensor should therefore have a very large dynamic range, which also becomes a factor in raising the parts costs.

On the other hand, it is inevitable that the fast-operating current sensor and the analog/digital signal processor are influenced largely by high-frequency components of radio noise and thermal noise, thereby lowering the S/N (signal to noise) ratio.

In this way, to produce voltage/current paired data in the starter-current increasing period involves a high S/N, a fast sampling performance and a wide dynamic range at the sensor and signal processing circuit. This is not practical as it burdens the circuit with a high operational performance. In other words, sampling voltage and current data during the starter-current increasing period is not practical.

To remove this difficulty, it may be possible to sample voltage and current data during a cranking period (or cranking time; refer to FIG. 13) following the starter-current increasing period in an engine startup period (refer to FIG. 13). In the cranking period, the engine starts to generate torque while the starter current decreases gradually. Hence using this cranking period, the burden of the sensor and circuit may be less.

However, since the cranking period is longer than the starter-current increasing period, the fact that changes in the polarized state of the battery during calculation of a charged state thereof cannot be negligible.

SUMMARY OF THE INVENTION

The present invention has been made in light of the problems set forth above, and has an object of providing an apparatus for calculating a quantity indicating a charged state (internal charged state or internal state) of a secondary battery in a precise and reliable manner by using circuit components whose operating speeds and precision degrees are avoided from increasing excessively.

In order to realize the above object, the present invention provides, as a basic structure, an apparatus for calculating a quantity indicating a charged state (also called an "internal charged state" or an "internal state") of a battery being mounted on a vehicle, the battery powering a starter starting up an engine mounted on the vehicle. The apparatus comprises a data acquiring unit configured to acquire a plurality of pairs of data consisting of current and voltage of the battery at predetermined sampling intervals during a cranking period of the engine in response to starting up the starter; a first calculating unit configured to calculate, as the quantity, at intervals, a value of an internal resistance of the battery based on the plurality of pairs of data of current and voltage; a second calculating unit configured to calculate an open voltage difference which is a difference between a pseudo circuit-open voltage of the battery given before starting up the starter and a pseudo circuit-open voltage of the battery given after the cranking period; and a correcting unit configured to correct the value of the internal resistance by using the open voltage difference, the corrected value of the internal resistance being indicative of the charged state of the battery. The pseudo circuit-open voltage is a battery voltage obtained on the condition that the charge and discharge current of the battery is regarded as being zero.

It is preferred that the correcting unit comprises means, for substituting the open voltage difference into a correcting function having a positive correlation with the open voltage difference and means for correcting the value of the internal resistance based on a value of the correcting function obtained by the substitution. By way of example, the first calculating unit comprises means for obtaining a regression line based on the plurality of pairs of sampled data of current and voltage, the regression line defining a relationship between the voltage and the current of the battery, and means for calculating a gradient of the obtained regression line as the value of the internal resistance. By way of example, the correcting unit is configured to correct the value of the internal resistance by adding the value of the correcting function to the value of the internal resistance.

In the corrected value of the internal resistance, the influence of changes in the polarized state of the battery is lessened. That is, thanks to the above basic structure, the error in estimating the internal resistance, which is attributable to changes in polarized states of the battery, can be lessened effectively, so that the estimation of the internal resistance becomes more accurate.

Hence, it is sufficient to sample pairs of voltage and current data during the cranking period immediately after the starter-current increasing period in the engine startup period (refer to FIG. 13). It is not required to sample data during the starter-current increasing period. Because the cranking period. is used for the sampling, it is possible to use a data acquisition device with a relatively narrower dynamic range and a relatively lower sampling rate. In the present invention, even such a data acquisition device can be used to calculate (estimate or detect) the internal resistance with precision, thus decreasing parts cost of the data acquisition device, that is, the charged-state quantity calculating apparatus of the present invention.

It is preferred that the correcting unit comprises means for substituting the open voltage difference into a correcting function having a positive correlation with the open voltage difference and means for correcting the value of the internal resistance based on a value of the correcting function obtained by the substitution.

An inventors' study showed that the open voltage difference ($\Delta Vo$) can be related well, in a positive correlation, to amounts of change in the internal resistance (Rd) which are caused a pseudo circuit-open voltage of the battery given before starting up the starter and a further pseudo circuit-open voltage of the battery given after the cranking period. Thus, the correcting function ($f(\Delta Vo)$) showing both the open voltage difference ($\Delta Vo$) and the internal resistance Rd can be memorized in advance. Applying the value of an open voltage difference ($\Delta Vo$) to be calculated to this correcting function ($f(\Delta Vo)$) allows a changed value ($\Delta Rd$) of the internal resistance (Rd) to be corrected. This provides a relatively simple calculation, while it is possible to reduce the errors of the internal resistance (Rd).

According to an inventor's estimation is that the open voltage difference ($\Delta Vo$) has a higher correlation with changes in polarized amounts of the battery, which are due to the discharge during the engine startup period, and the internal resistance (Rd) has a correlation with changes in the polarized amounts of the battery. Errors attributable to the polarized amounts of the battery which are included in values of the internal resistance (Rd) can therefore be reduced by the correction on the correcting function ($f(\Delta Vo)$). Thus the foregoing advantage can be obtained.

DETAILED DESCRIPTION OF THE PREFERRED EMBODIMENTS

Hereinafter, various preferred embodiments of a charged-state quantity calculating apparatus for a secondary battery according to the present invention will now be described with reference to the accompanying drawings.

First Embodiment

Referring to FIGS. 1-6, a first embodiment of the charged-state quantity calculating apparatus according to the present invention will now be described. In the present embodiment, the calculating apparatus is reduced into practice by being functionally incorporated in an on-vehicle power system 1.

Figure 1:
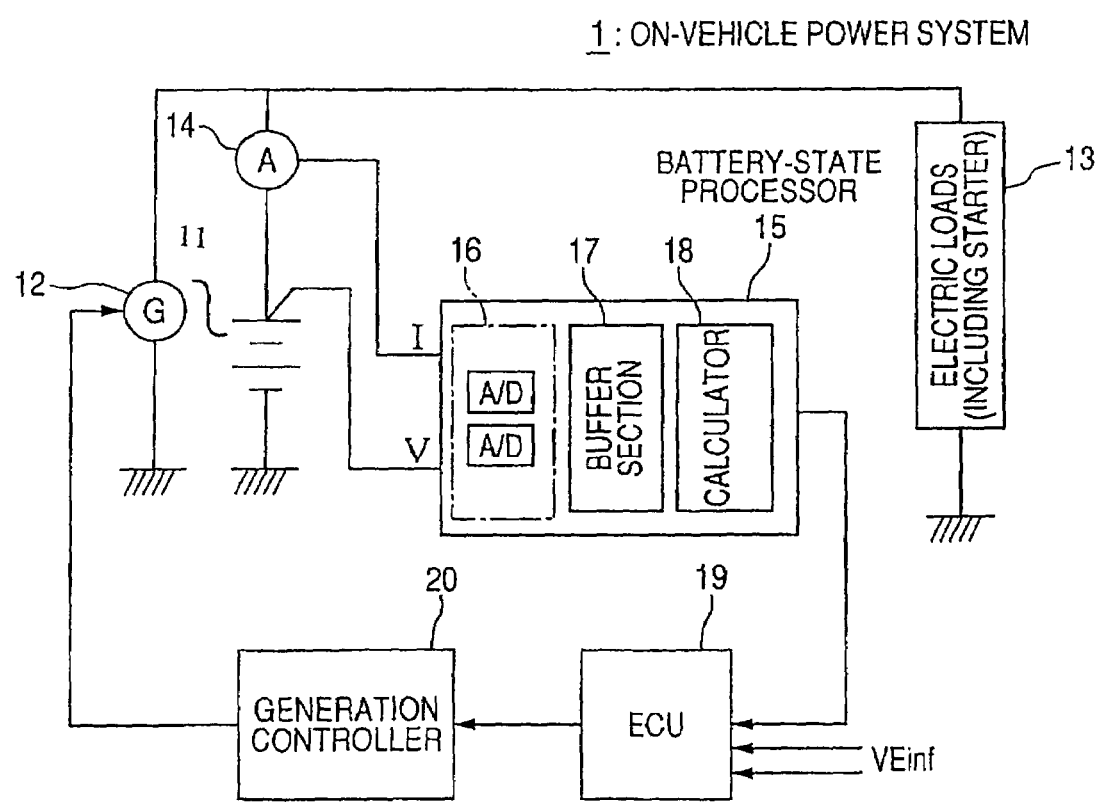
FIG. 1 is a block diagram outlining the configuration of an on-vehicle power system functionally includes a charged-state quantity calculating apparatus for an on-vehicle battery, according to a first embodiment of the present invention.

FIG. 1 shows a block diagram outlining the configuration of the on-vehicle power system 1.

The on-vehicle power system 1 shown in FIG. 1 includes a battery 11 which composes a power storing device to store electric power therein, an on-vehicle generator 12 driven by an on-vehicle engine (not shown), on-vehicle electric loads 13, a current sensor 14, and a battery-state processor 15. Of these, the battery 11 is a target of which internal state, that is, charged state is detected. This battery 11 is composed of a lead battery, a nickel metal-hydride battery, a lithium battery, or others. The on-vehicle electric loads 13 include a starter for starting up the engine.

The current sensor 14 has the capability of detecting charge and discharge currents as an analogue-format electrical signal indicating these currents and outputting the detected signal to the battery-state processor 15 through a line connecting the current sensor 14 and the processor 15.

In addition, an output terminal of the battery 11 is connected to the battery-state processor 15, so that a terminal voltage of the battery 11 is supplied to the processor 15 in an analogue-format electrical signal.

The battery-state processor 15 serves as the charged-state quantity calculating apparatus according to the present invention. The battery-state processor 15 comprises A/D converters 16, a buffer section 17, and a calculator 18. The A/D converters 16 perform sampling and analogue/digital conversion on the inputted analogue-format voltage and current signals at a predetermined sampling frequency, producing digital-format voltage and current data.

The buffer section 16 is used to memorize, as a group of pairs of digital data, both of the current Ib coming from the current sensor 14 and the terminal voltage Vb at the battery 11.

The calculator 18 is made up of, for example, a computer system comprising, though not shown, a CPU (central processing unit) and memories for storing predetermined one or more computer programs for the CPU and for memorizing temporal data necessary for the calculation. The computer programs include a program to process pairs of sampled voltage/current data stored in the buffer section 17 in such a manner that various quantities indicative of the charged state of the battery 11 is calculated by the CPU, i.e., the calculator 18. The battery-state processor 15 is formed to output a digital-format electrical signal showing such charged-state quantities.

As shown in FIG. 1, the on-vehicle power system 1 further includes an ECU (electronic control unit) 19 and a generation controller 20. The ECU 19 is configured to receive not only the signal from the battery-state processor 15 but also vehicle information VEinf including engine states, vehicle speed, a speed of rotation of the generator 12. Using such pieces of inputted information, the ECU 19 is able to give, to the generation controller 20, commands for generation and generation-stop to regulate an amount of power generated at the generator 12 at a predetermined target value.

Figure 2:
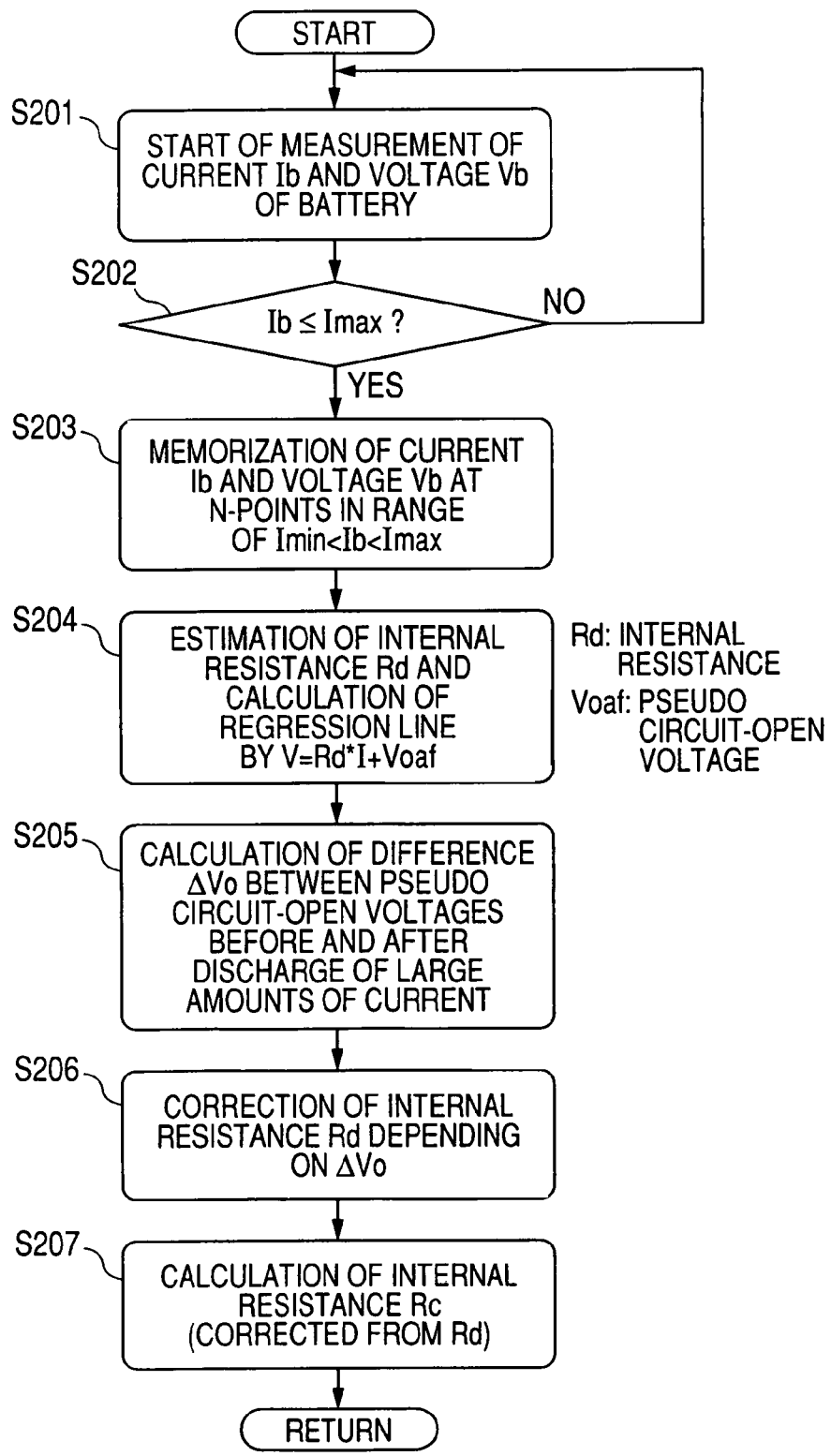
FIG. 2 is a flowchart outlining the processing for calculating (i.e., detecting) an internal resistance of the battery in the first embodiment.

Referring to FIG. 2, the operation to detect an internal resistance of the battery 11, which is repeatedly executed by the battery-state processor 15, will now be described.

Measurement of current Ib and Vb of the battery 11 is started (step S201), and it is determined whether or not there have been a discharge of a large amount of current (i.e., startup of the starter for the vehicle engine) (step S202). That is, the determination is made such that the discharge current Ib has decreased down to a predetermined maximum current value Imax (refer to FIG. 3). When a relationship of Ib≦Imax is met, it is recognized that a cranking period (refer to FIG. 13) has been started. Responsively to this determination, the acquisition of paired data of current Ib and voltage Vb is also started repeatedly at predetermined sampling intervals (refer to FIG. 12), and the data acquisition is continued until a time instant when the current Ib returns up to a predetermined minimum current value Imin (refer to FIG. 3: step S203). In other words, the data acquisition is continued during the cranking period so as to store, into the buffer section 17, paired data of current Ib and voltage Vb acquired at N-points.

Figure 3:
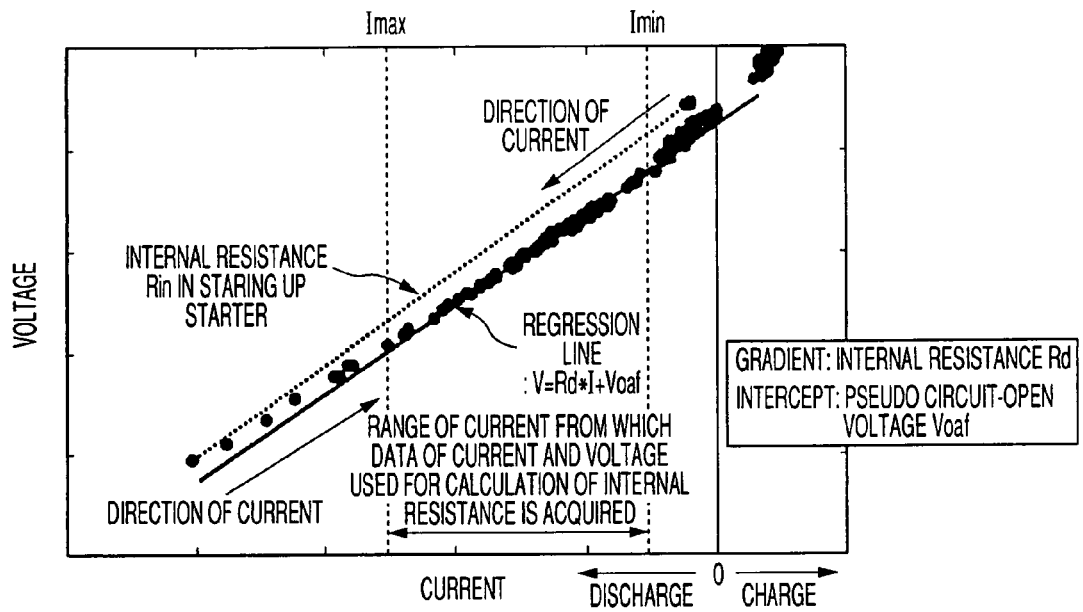
FIG. 3 is a graph exemplifying a current/voltage characteristic being obtained in discharging a large amount of current (i.e., during a cranking period)

In the processor 15, at a calculation timing (refer to FIG. 12), the calculator 18 uses memorized paired data of current Ib and voltage Vb to plot them two-dimensionally as shown in FIG. 3, and a regression line (V=Rd·I+Voaf) is calculated (step S204), in which Rd represents an internal resistance of the battery 11 and Voaf represents a pseudo circuit-open voltage. Then an open voltage difference ΔVo is used for correcting the internal resistance value is calculated (step S205). This open voltage difference ΔVo represents a difference between the pseudo circuit-open voltages Voaf obtained before the startup of the starter (i.e., before discharging a large amount of current) and after the cranking period (i.e., after the discharge).

Then, the calculated open voltage difference ΔVo is substituted into a previously memorized correcting function f(ΔVo) to obtain a value thereof (step S206). And the obtained correcting function f(ΔVo) is added to the internal resistance Rd for correction, so that a corrected internal resistance Rc is calculated (step S207). As will be described later, the internal resistance Rd has a high positive correlation with open voltage difference ΔVo.

The correcting function f(ΔVo) can be defined as "K1·ΔVo−K2," where K1 and K2 are predetermined constants each having a positive value and ΔVo denotes the open voltage difference. This definition is simple, but it was confirmed to give a high accuracy to the calculation of the internal resistance Rd. Preferably, K1 was 1.5 and K2 was 0.4.

The foregoing step S204 for calculating the internal resistance Rd and the pseudo circuit-open voltage Voaf, step S205 for calculating the open voltage difference ΔVo, and step S206 for correcting the internal resistance Rd will now be detailed more.

Figure 12:
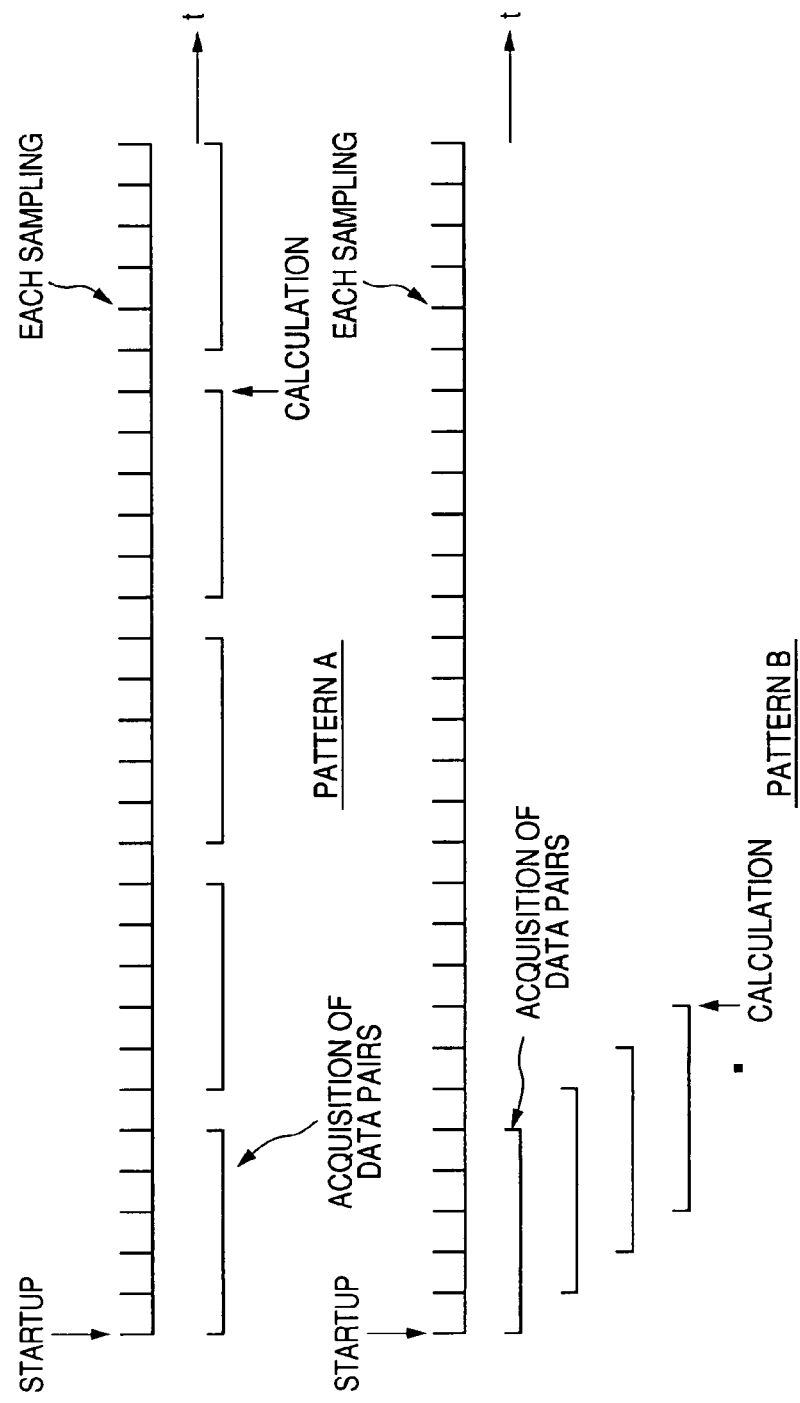
FIG. 12 exemplifies timing of voltage/current data acquisition (sampling) and calculation of quantities indicative of the charged state of the battery.
Figure 13:
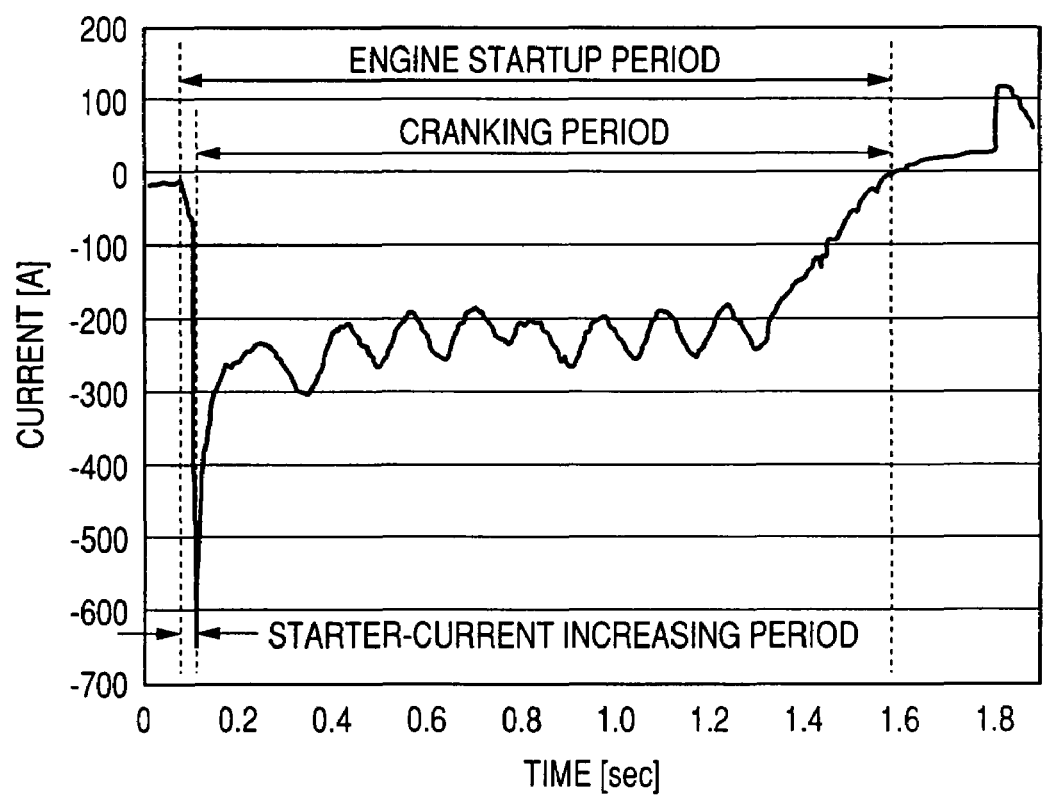
FIG. 13 exemplifies a graph showing a temporal relationship among an engine startup period, a starter-current increasing period, and a cranking period.

FIG. 12 exemplifies timing of the data (current and voltage) acquisition and the calculation described above. Patterns A and B gives some patterns for the data-acquisition and calculation timing, but these patterns A and B are just examples. Other patterns A and B may also be available.

Calculation of Internal Resistance Rd and Pseudo Circuit-Open Voltages Voaf

FIG. 3 exemplifies a current/voltage characteristic to be obtained when a large amount of current is discharged during the cranking period. A regression line is estimated on a group of pairs of current and voltage during a predetermined current range "Imax to Imin." The regression line provides a gradient (i.e., angle), which is an internal resistance Rd, and an intercept crossing an axis at the current "0." which is a pseudo circuit-open voltage Voaf. Thus, those values Rd and voltage can be calculated.

The current range "Imax to Imin" is defined by the maximum current value Imax and the minimum current value Imin, whose values are decided based on a dynamic range of the current sensor 14 to be mounted. By way of example, the current range is set to a range of −500 A to −100 A.

Calculation of Open Voltage Difference ΔVo

Figure 4:
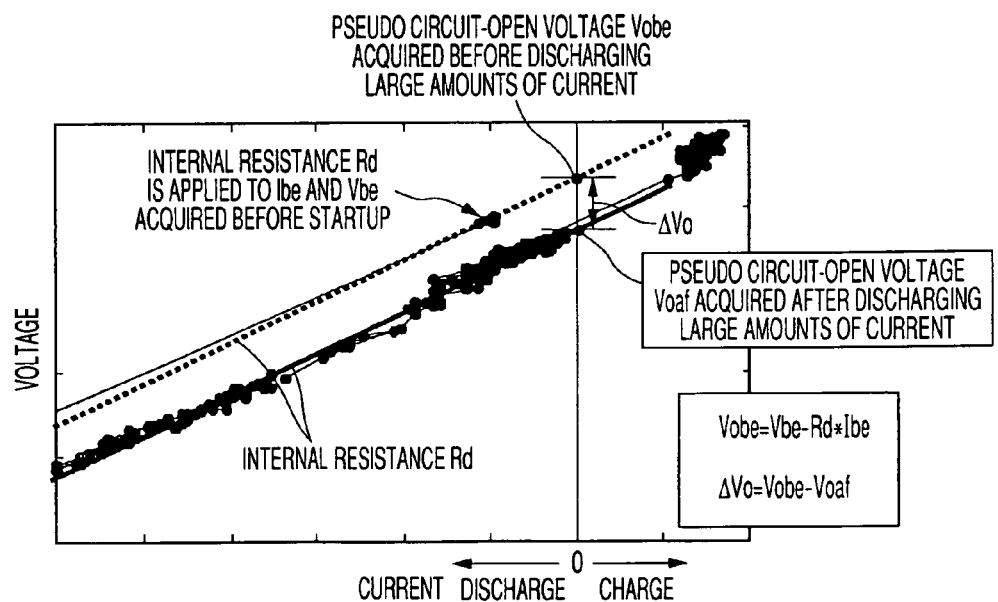
FIG. 4 is a graph exemplifying changes in the current/voltage characteristic of the battery observed when a starter for an engine is started up.

FIG. 4 explains how to calculate the open voltage difference ΔVo. This open voltage difference ΔVo is expressed as "Vobe-Voaf," where Vobe represents a pseudo circuit-open voltage obtained before the startup of the starter and Voaf represents a pseudo circuit-open voltage obtained after the cranking.

Using the internal resistance Rd, which is obtained already, and current Ibe and voltage Vbe obtained before starting up the starter, a voltage is calculated as $$Vobe = Vbe - Rd \cdot Ibe \quad (1),$$

which is a pseudo circuit-open voltage Vobe to be obtained before starting up the starter.

In a similar way to this, using the internal resistance Rd, which is obtained already, and current Iaf and voltage Vaf obtained after the cranking, a voltage is calculated as $$Voaf = Vaf - Rd \cdot Iaf \quad (2),$$

which is a pseudo circuit-open voltage Voaf to be obtained after the cranking.

Then, an open voltage difference ΔVo is calculated on a formula of $$\Delta Vo = Vbe - Vaf \quad (3).$$

Correction of Internal Resistance Rd

Figure 5:
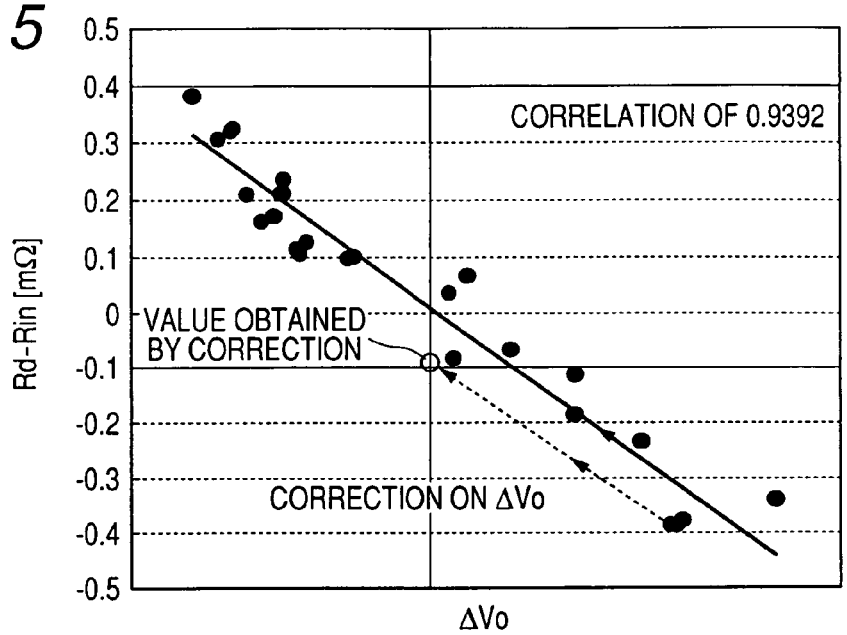
FIG. 5 is a graph explaining how to correct the value of an internal resistance in accordance with an open voltage difference.

FIG. 5 explains how to correct the internal resistance Rd based on the calculated open voltage difference ΔVo.

By the way, an internal resistance value of the battery 11 that is desired originally is a value of the internal resistance Rin presented when the starter is started up. However, as stated already, mounting a current sensor having a dynamic range which is sufficient for the current flowing when the starter is started up is confronted with difficulties in precision and parts cost.

Accordingly, to overcome those difficulties, it is an object to accurately estimate the internal resistance Rin over a more practical current range (for example, discharge currents −500 to 0 A). The present inventors conducted experiments to examine a relationship between an estimated error (=Rin−Rd) of a measured internal resistance Rin and an open voltage difference ΔVo. The experiments showed that there was a high correlation between the estimated error (=Rin−Rd) and the open voltage difference ΔVo, which is illustrated in FIG. 5.

Hence, the high correlation gives an understanding that correcting the internal resistance Rd based on the open voltage difference ΔVo leads to a precise estimation of the internal resistance Rin. By way of example, a formula for correcting the value of the internal resistance Rd, which was derived from the experiments, is $$Rc = -1.5(0.26 - \Delta Vo) + Rd \quad (4).$$

In this way, correcting the internal resistance Rd depending on the open voltage difference ΔVo alternatively gives the value of the internal resistance Rin being obtained when the starter is started up. Thus, the correction on the open voltage difference ΔVo is effective. This is also clear from FIG. 6, in which there are provided measurement data of errors in estimating the internal resistance Rin. Through experiments conducted by the present inventors, a difference (error) between each of values of the internal resistance Rin obtained when a starter was started up (the number of trials is 26 times) and an internal resistance Rd calculated with the correction at each trial was observed for estimation.

Figure 6:
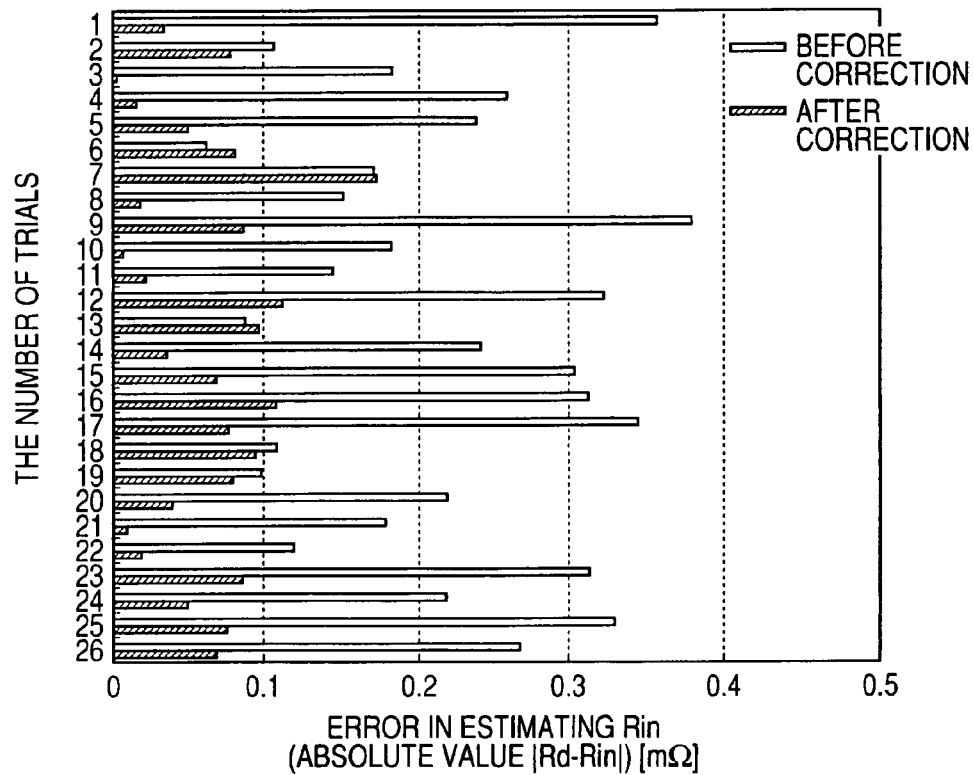
FIG. 6 is a bar graph exemplifying experimental results of errors in estimating the internal resistance.

As shown in FIG. 6, a maximum of the error obtained without the correction on the open voltage difference ΔVo was 0.38 mΩ. In contrast, it is understood that the correction of the calculated internal resistance Rd on the open voltage difference ΔVo reduced the maximum error down to 0.17 mΩ. In terms of an average number of errors, a reduction from 0.22 mΩ to 0.06 mΩ was realized, which demonstrates that the internal resistance Rin presented at starting up the starter can alternatively be estimated with higher precision.

Second Embodiment

Figure 7:
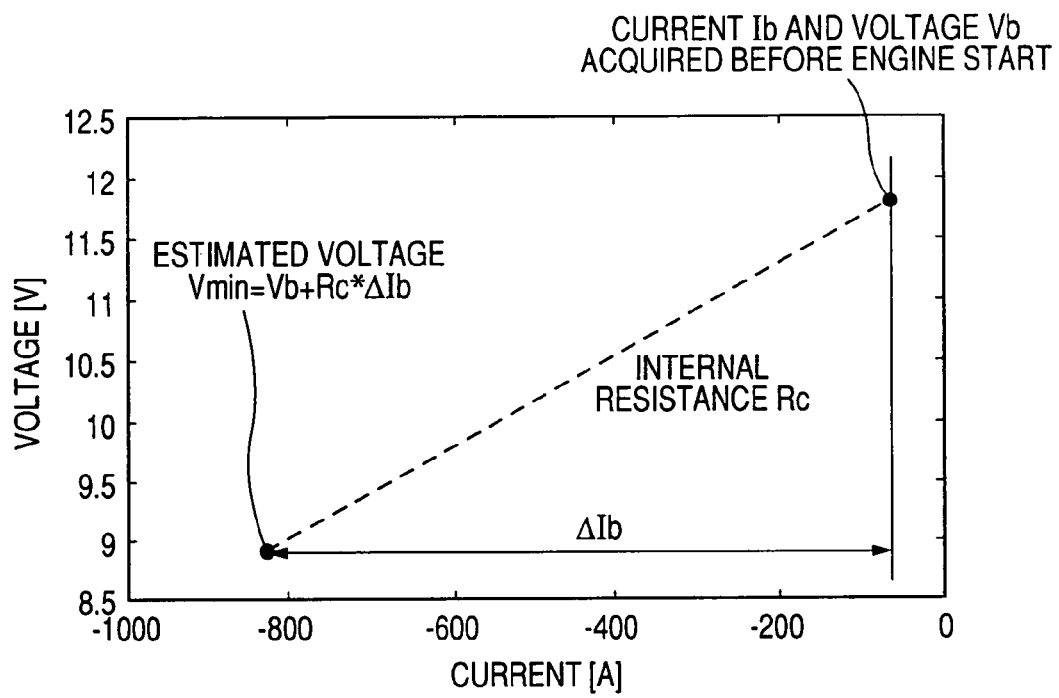
FIG. 7 is a graph explaining how to estimate a lower limit voltage in starting up the starter, the estimating being performed in a second embodiment of the present invention.
Figure 8:
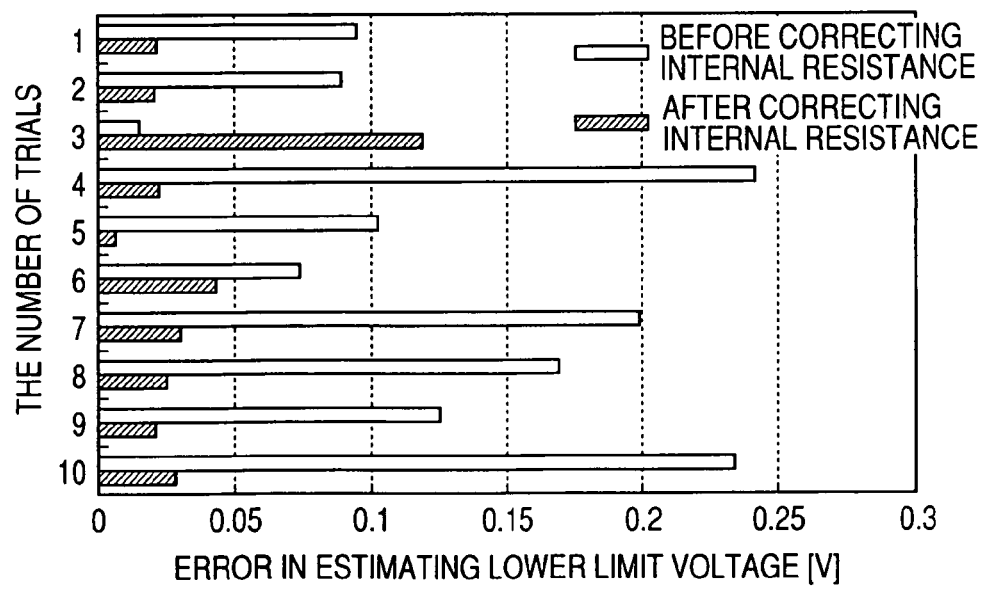
FIG. 8 is a bar graph exemplifying experimental results of errors in estimating the lower limit voltage as to both cases where the correction based on the open voltage difference is performed and is not performed.

Referring to FIGS. 7 and 8, a second embodiment of the charged-state quantity calculating apparatus according to the present invention will now be described. In the same way as the first embodiment, the calculating apparatus is reduced into practice by being functionally incorporated in an on-vehicle power system 1, which is the same in the configuration as that shown in FIG. 1.

The on-vehicle power system 1 according to the second embodiment is characteristic of using the internal resistance Rc on the formula (4) in order to estimate a lower limit voltage in starting up the engine (i.e., the starter). This estimation is very important in situations such as idle-stop running requiring frequent engine restarts (engine stop to engine restart in the idling) in order to secure that the battery 11 keeps a sufficient restart performance.

The present embodiment exemplifies estimating the lower limit voltage in the next startup the engine from the calculated internal resistance Rc. This estimation is executed by the CPU of the battery-state processor 15.

Referring to FIG. 7, how to estimate the lower limit voltage will now be described. Using a value of the internal resistance value Rc which was obtained at the latest calculation timing and values of the current Ib and voltage Vb obtained before starting up the engine gives an estimated value Vmin to the lower limit voltage. Practically, the following formula (5) gives the estimated value Vmin of the lower limit voltage:

$$Vmin = Vb + Rc \cdot \Delta Ib \quad (5),$$

where ΔIb represents a change from the current Ib obtained before starting up the engine and is set to a value based on the discharge current in the startup.

FIG. 8 exemplifies estimated results of the lower limit voltage. To obtain this example, experiments were conducted by the present inventors to estimate an error between each of the values of the lower limit voltage actually obtained when a starter was started up (the number of trials is 10 times) and an estimated value of the lower limit voltage at each trial. When compared with a case where there is no correction of the internal resistance on the open voltage difference ΔVo, a maximum of the errors in estimating the lower limit voltage is reduced down from 0.24 V to 0.12 V. In terms of an average of the errors, a reduction from 0.13 V to 0.03 V was realized. This demonstrates that the lower limit voltage can be estimated with higher precision through the correction of the internal resistance described in the first embodiment.

Third Embodiment

Figure 9:
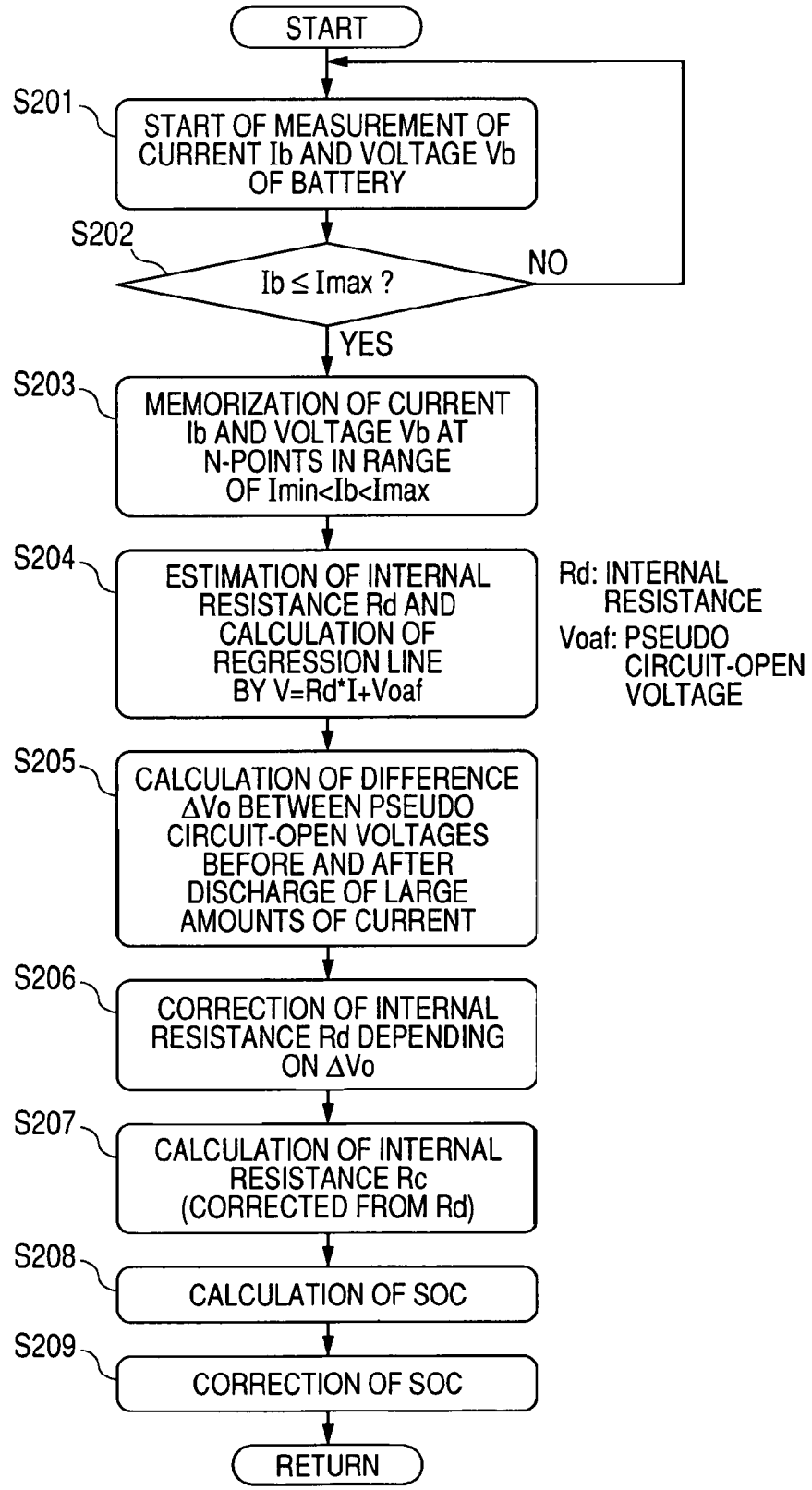
FIG. 9 is a flowchart outlining the processing additionally including correction of the internal resistance based on a charged rate (SOC), which is carried out in a third embodiment of the present invention.
Figure 10:
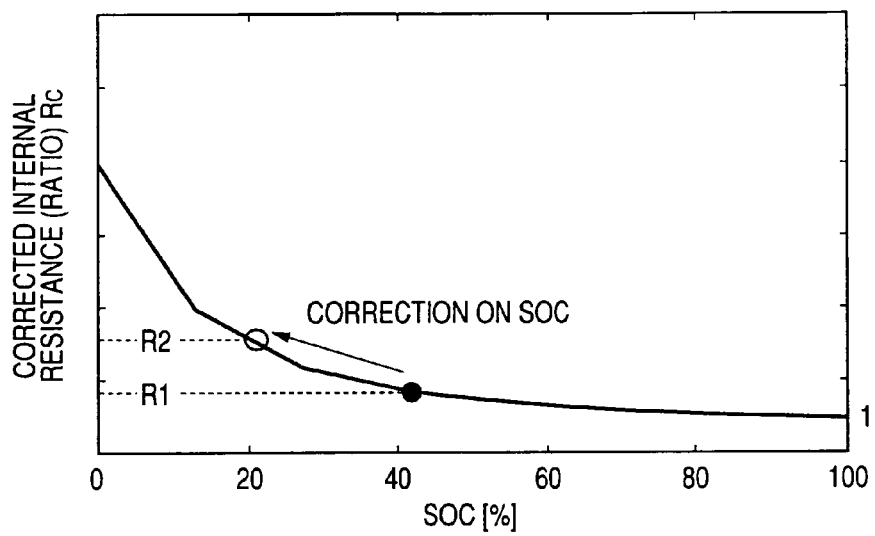
FIG. 10 is a characteristic graph exemplifying a relationship between the charged rate and the internal resistance.
Figure 11:
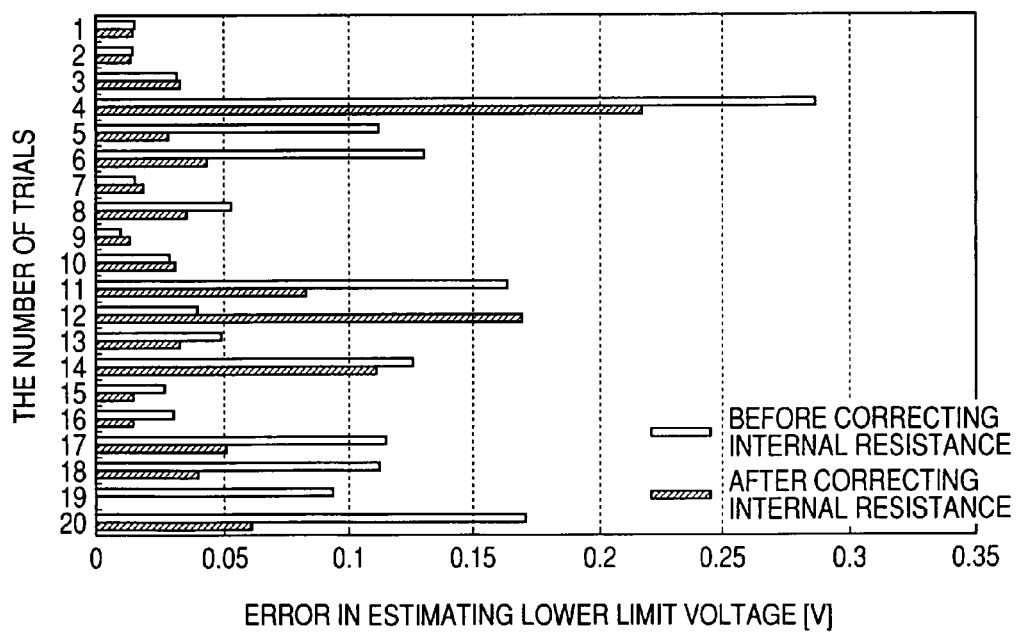
FIG. 11 is a bar graph exemplifying experimental results of errors in estimating the lower limit voltage as to both cases where the correction based on the charged rate is performed and is not performed.

Referring to FIGS. 9-11, a third embodiment of the charged-state quantity calculating apparatus according to the present invention will now be described. In the same way as the foregoing embodiments, the calculating apparatus is reduced into practice by being functionally incorporated in an on-vehicle power system 1, which is the same in the configuration as that shown in FIG. 1.

The on-vehicle power system 1 according to the third embodiment further improves the performance to be obtained from the configuration in the second embodiment.

The second embodiment shows that, as described, using the internal resistance Rc allows the lower limit voltage to be estimated with higher precision. In contrast, the third embodiment improves a difficulty which may occur in a situation where the internal state (i.e., charged state) of the battery 11. changes in a period of time from the calculation of the internal resistance Rc to the next startup of the engine. In such a situation, the value of the internal resistance Rc may change, resulting in a possibility that there is caused an error in the lower limit voltage Vmin (=Vb+Rc·ΔIb).

To overcome such a situation, the CPU of the battery-state processor 15 is configured to repeatedly execute a series of processes shown in FIG. 9.

Practically, as shown in FIG. 9, the processes at step S208 and S209 are added to the processes at steps S201 to S207 which are identical to those in FIG. 2. That is, as shown in step S208 in FIG. 9, the processes for obtaining the corrected internal resistance Rc (steps S201 to S207) are followed by calculating an SOC (state of charge: %) of the battery 11, which is a figure to express a present charged rate (step S208).

Then the SOC is corrected as shown in FIG. 10 (step S209). To be specific, data of a function showing a relationship between the SOC and the corrected internal resistance Rc is read out from the memory in the battery-state processor 15. The data of the function, which can be exemplified as in FIG. 10, is previously decided and stored in the memory such as ROM. And the currently calculated value of the SOC is applied to the read-out function to calculate a present value (normalized ratio) R2 of the corrected internal resistance Rc. At the last calculation timing, in the same way, the calculated value of the SOC was applied to the read-out function to calculate a value (normalized ratio) R1 of the corrected internal resistance Rc. Hence a ratio of R2/R1 is calculated, and the value of the corrected internal resistance Rc calculated last time is then multiplied by the calculated ratio of R2/R1 to correct the value of the corrected internal resistance Rc calculated at present.

The advantages of the third embodiment, which are thanks to the correction of the corrected internal resistance Rc based on the charged rate (SOC), are as follows.

The internal resistance of the battery 11 shows a dependency on the SOC as exemplified in FIG. 10, which shows a ratio of the internal resistance Rc at each value of the SOC in cases where the internal resistance RC is assigned to 1 at a 100% of SOC. The characteristic of this dependency is true of the foregoing corrected internal resistance Rc. The SOC can be estimated by using various known techniques, such as a technique that uses a pseudo circuit-open voltage and a technique that uses an amount of accumulated current.

FIG. 11 exemplifies results in which errors in estimating the lower limit voltage were tested when the foregoing correction on the SOC is applied to the corrected internal resistance Rc. In the case of FIG. 11, the corrected internal resistance Rc was corrected in cases where the SOC changed by some 5-20%.

In this way, performing the corrected internal resistance Rc in compliance with the SOC, i.e., charged rate, allows the maximum error in estimating the lower limit voltage to decrease from 0.29 V down to 0.22 V, compared to a case where the SOC-dependent correction is not carried out. From another perspective, it was found that an average of the errors decreased from 0.08 V to 0.05 V. Since the internal resistance RC once corrected in accordance with the open voltage difference $\Delta Vo$ can be further be corrected depending on the SOC, the lower limit voltage can be estimated more accurately.

The present invention may be embodied in several other forms without departing from the spirit thereof. The embodiments and modifications described so far are therefore intended to be only illustrative and not restrictive, since the scope of the invention is defined by the appended claims rather than by the description preceding them. All changes that fall within the metes and bounds of the claims, or equivalents of such metes and bounds, are therefore intended to be embraced by the claims.

What is claimed is:

1. An apparatus for calculating a quantity indicating a charged state of a battery being mounted on a vehicle, the battery powering a starter starting up an engine mounted on the vehicle, the apparatus comprising:

a data acquiring unit configured to acquire a plurality of pairs of data consisting of current and voltage of the battery at predetermined sampling intervals during a cranking period of the engine in response to starting up the starter;

a first calculating unit configured to calculate, as the quantity indicating the charged state of the battery, at intervals, a value of an internal resistance of the battery based on the plurality of pairs of data of current and voltage;

a second calculating unit configured to calculate, based on the plurality of pairs of data of current and voltage, an open voltage difference which is a difference between a pseudo circuit-open voltage of the battery given before starting up the starter and a pseudo circuit-open voltage of the battery given after the cranking period; and a correcting unit configured to correct the value of the internal resistance based on the open voltage difference, the corrected value of the internal resistance being indicative of the charged state of the battery that supplies the current to the starter which is used in a starting-up operation for the engine.

2. The apparatus of claim 1, wherein
the correcting unit comprises means for substituting the open voltage difference into a correcting function having a positive correlation with the open voltage difference and means for correcting the value of the internal resistance based on a value of the correcting function obtained by the substitution.

3. The apparatus of claim 2, wherein the first calculating unit comprises
means for obtaining a regression line based on the plurality of pairs of sampled data of current and voltage, the regression line defining a relationship between the voltage and the current of the battery, and
means for calculating a gradient of the obtained regression line as the value of the internal resistance.

4. The apparatus of claim 3, wherein the correcting unit is configured to correct the value of the internal resistance by adding the value of the correcting function to the value of the internal resistance.

5. The apparatus of claim 4, wherein the correcting function is defined as "K1·$\Delta Vo$−K2," where K1 and K2 are predetermined constants each having a positive value and $\Delta Vo$ denotes the open voltage difference.

6. The apparatus of claim 5, further comprising
a third calculating unit configured to calculate, as the quantity indicating the charged state of the battery, a charged rate of the battery at intervals; and
a further correcting unit configured to correct, at a current calculation timing based on the intervals, the value of the internal resistance calculated at a last calculation timing based on the intervals, on the basis of the charged rate calculated at the present calculation timing and the charged rate calculated at the last calculation timing.

7. apparatus of claim 1, wherein the first calculating unit comprises
means for obtaining a regression line based on the plurality of pairs of sampled data of current and voltage, the regression line defining a relationship between the voltage and the current of the battery, and
means for calculating a gradient of the obtained regression line as the value of the internal resistance.

8. apparatus of claim 7, wherein the correcting unit is configured to correct the value of the internal resistance by adding the value of the correcting function to the value of the internal resistance.

9. apparatus of claim 8, wherein the correcting function is defined as "K1·$\Delta Vo$−K2," where K1 and K2 are predetermined constants each having a positive value and ΔVo denotes the open voltage difference.

10. The apparatus of claim 9, further comprising
a third calculating unit configured to calculate, as the quantity indicating the charged state of the battery, a charged rate of the battery at intervals; and
a further correcting unit configured to correct, at a current calculation timing based on the intervals, the value of the internal resistance calculated at a last calculation timing based on the intervals, on the basis of the charged rate calculated at the present calculation timing and the charged rate calculated at the last calculation timing.

11. The apparatus of claim 1, further comprising
a third calculating unit configured to calculate, as the quantity indicating the charged state of the battery, a charged rate of the battery at intervals; and
a further correcting unit configured to correct, at a current calculation timing based on the intervals, the value of the internal resistance calculated at a last calculation timing based on the intervals, on the basis of the charged rate calculated at the present calculation timing and the charged rate calculated at the last calculation timing.

12. The apparatus of claim 2, further comprising
a third calculating unit configured to calculate, as the quantity indicating the charged state of the battery, a charged rate of the battery at intervals; and
a further correcting unit configured to correct, at a current calculation timing based on the intervals, the value of the internal resistance calculated at a last calculation timing based on the intervals, on the basis of the charged rate calculated at the present calculation timing and the charged rate calculated at the last calculation timing.

13. An apparatus for calculating a quantity indicating a charged state of a battery being mounted on a vehicle, the battery powering a starter starting up an engine mounted on the vehicle, the apparatus comprising:
acquiring means for acquiring a plurality of pairs of data consisting of current and voltage of the battery at predetermined sampling intervals during a cranking period of the engine in response to starting up the starter;
first calculating means for calculating, as the quantity indicating the charged state of the battery, at intervals, a value of an internal resistance of the battery based on the plurality of pairs of sampled data of current and voltage;
second calculating means for calculating, based on the plurality of pairs of data of current and voltage, an open voltage difference which is a difference between a pseudo circuit-open voltage of the battery given before starting up the starter and a pseudo circuit-open voltage of the battery given after the cranking period; and
correcting means for correcting the value of the internal resistance based on the open voltage difference, the corrected value of the internal resistance being indicative of the charged state of the battery that supplies the current to the starter which is used in a starting-up operation for the engine.

14. The apparatus of claim 13, wherein
the correcting means comprises means for substituting the open voltage difference into a correcting function having a positive correlation with the open voltage difference and means for correcting the value of the internal resistance based on a value of the correcting function obtained by the substitution.

15. A method of calculating a quantity indicating a charged state of a battery being mounted on a vehicle, the battery powering a starter starting up an engine mounted on the vehicle, the method comprising steps of:
acquiring a plurality of pairs of data consisting of current and voltage of the battery at predetermined sampling intervals during a cranking period of the engine in response to starting up the starter;
calculating, as the quantity indicating the charged state of the battery, at intervals, a value of an internal resistance of the battery based on the plurality of pairs of sampled data of current and voltage;
calculating, based on the plurality of pairs of data of current and voltage, an open voltage difference which is a difference between a pseudo circuit-open voltage of the battery given before starting up the starter and a pseudo circuit-open voltage of the battery given after the cranking period; and
correcting the value of the internal resistance based on the open voltage difference, the corrected value of the internal resistance being indicative of the charged state of the battery that supplies the current to the starter which is used in a starting-up operation for the engine.

* * * * *